United States Patent
Lee et al.

(10) Patent No.: US 7,886,687 B2
(45) Date of Patent: Feb. 15, 2011

(54) PLASMA PROCESSING APPARATUS

(75) Inventors: Young Jong Lee, Sungnam-shi (KR);
Jun Young Choi, Seoul (KR); Saeng Hyun Jo, Daejeon (KR); Young-Joo Hwang, Seoul (KR); Jong-Cheon Kim, Pyeongtaek (KR)

(73) Assignee: Advanced Display Process Engineering Co. Ltd., Sungnam-shi (KR)

( * ) Notice: Subject to any disclaimer, the term of this patent is extended or adjusted under 35 U.S.C. 154(b) by 842 days.

(21) Appl. No.: 11/313,022

(22) Filed: Dec. 20, 2005

(65) Prior Publication Data

US 2006/0137820 A1    Jun. 29, 2006

(30) Foreign Application Priority Data

Dec. 23, 2004  (KR) ............ 10-2004-0110832
Dec. 23, 2004  (KR) ............ 10-2004-0110937
Dec. 23, 2004  (KR) ............ 10-2004-0111019

(51) Int. Cl.
*C23C 16/50*    (2006.01)
*C23C 16/503*   (2006.01)
*C23C 16/505*   (2006.01)
*C23C 16/509*   (2006.01)
*C23F 1/00*     (2006.01)
*H01L 21/306*   (2006.01)
*C23C 16/06*    (2006.01)
*C23C 16/22*    (2006.01)

(52) U.S. Cl. ............... 118/723 E; 156/345.43; 156/345.45

(58) Field of Classification Search ........ 118/723 E; 156/345.43, 345.45
See application file for complete search history.

(56) References Cited

U.S. PATENT DOCUMENTS

| | | | | |
|---|---|---|---|---|
| 5,421,406 A | * | 6/1995 | Furusawa et al. | 165/185 |
| 5,792,261 A | * | 8/1998 | Hama et al. | 118/723 I |
| 5,846,883 A | * | 12/1998 | Moslehi | 438/711 |
| 5,950,925 A | * | 9/1999 | Fukunaga et al. | 239/132.3 |
| 6,036,878 A | * | 3/2000 | Collins | 216/68 |
| 6,821,377 B2 | | 11/2004 | Saito et al. | |
| 2003/0047282 A1 | * | 3/2003 | Sago et al. | 156/345.34 |
| 2005/0016455 A1 | * | 1/2005 | Cho et al. | 118/723 E |

* cited by examiner

*Primary Examiner*—Rudy Zervigon
(74) *Attorney, Agent, or Firm*—KED & Assoicates, LLP

(57) ABSTRACT

A plasma processing apparatus for generating plasma in a chamber maintained in a vacuum state and processing a substrate using the plasma. The plasma processing apparatus includes a refrigerant channel for circulating a refrigerant formed in a shower head, thereby easily controlling the temperature of the shower head and improving the reproducibility of plasma treatment.

10 Claims, 6 Drawing Sheets

PLASMA PROCESSING APPARATUS

CROSS REFERENCE TO RELATED APPLICATIONS

The present application claims priority to Korean Patent Application No. 10-2004-0110832 filed on Dec. 23, 2004, Korean Patent Application No. 10-2004-0110937 filed on Dec. 23, 2004, and Korean Patent Application No. 10-2004-0111019 filed on Dec. 23, 2004, all of which are incorporated herein by reference.

BACKGROUND OF THE INVENTION

1. Field of the Invention

The present invention relates to a plasma processing apparatus, which generates plasma in a chamber maintained in a vacuum state and processes a substrate using the plasma.

2. Description of the Related Art

Plasma processing apparatuses, which process the surface of a substrate using plasma, have been widely used in a process for manufacturing a semiconductor device and a liquid crystal display device. The plasma processing apparatuses include a plasma etching apparatus for performing etching of a substrate and a plasma Chemical Vapor Deposition (CVD) apparatus for performing CVD of a substrate.

As shown in FIG. 1, a plasma processing apparatus 1 comprises two flat plate-type electrodes 10 and 20 located in parallel such that they face each other. A substrate S is mounted on the lower electrode 20. Accordingly, the lower electrode 20 may be referred to as "a substrate mount".

Further, internal elevating pins 30 and external elevating bars (not shown) for assisting the carrying of the substrate S into and out of the plasma processing apparatus 1 are provided in the plasma processing apparatus 1, as shown in FIG. 1. The internal elevating pins 30 are located in through holes 22 formed through edges of the lower electrode 20, and move vertically in the through holes 22.

The external elevating bars are provided at the outside of the lower electrode 20. That is, the external elevating bars are located in spaces formed between side walls of the lower electrodes 20 and the side walls of the plasma processing apparatus 1, and move vertically.

An exhaust unit 40 for exhausting inner gas to the outside is formed through the plasma processing apparatus 1. The exhaust unit 40 removes gas in the plasma processing apparatus 1 by suction and maintains a vacuum state of the plasma processing apparatus 1 using a pump (not shown) provided at the outside of the plasma processing apparatus 1.

The upper electrode 10 is located at a position facing the lower electrode 20. The upper electrode 10 serves as a process gas supply unit for supplying process gas to a space between the upper and lower electrodes 10 and 20 as well as an electrode. Accordingly, as shown in FIG. 1, a shower head 12 is connected to the lower portion of the upper electrode 10. The shower head 12 has a plurality of process gas diffusing holes 14 having a fine diameter. The shower head 12 uniformly supplies the process gas to the space between the upper and lower electrodes 10 and 20. The process gas supplied to the space between the upper and lower electrodes 10 and 20 is converted into plasma by high-frequency power applied to the upper and lower electrodes 10 and 20, and the plasma processes the surface of the substrate S.

A refrigerant channel 16 for circulating a refrigerant therethrough is formed in the upper electrode 10. The refrigerant channel 16 passes through the upper electrode 10 in the horizontal direction, and is uniformly disposed throughout all regions of the upper electrode 10. One end of the refrigerant channel 16 is connected to a refrigerant supply pipe 17 communicating with the outside, and the other end of the refrigerant channel 16 is connected to a refrigerant collection pipe 18. Accordingly, the refrigerant channel 16 receives a new refrigerant from the refrigerant supply pipe 17 and returns the waste refrigerant to the refrigerant collection pipe 18, thereby circulating the refrigerant. The refrigerant channel 16 serves to prevent a process performed by the plasma processing apparatus 1 from being affected by the increase in the temperature of the shower head 12 due to the generation of plasma.

Since the conventional plasma processing apparatus 1 has the refrigerant channel 16, which is not formed directly in the shower head 12 but is formed in the upper electrode 10, so that the shower head 12 is indirectly cooled, it is not easy to control the temperature of the shower head 12. When the temperature of the shower head 12 is increased due to the difficulty in controlling the temperature of the shower head 12, high-frequency power transmission efficiency is decreased and affects etch rate or uniformity in etching, thereby deteriorating the reproducibility of plasma treatment.

SUMMARY OF THE INVENTION

Therefore, the present invention has been made in view of the above problems, and it is an object of the present invention to provide a plasma processing device, in which the temperature of a shower head is directly adjusted, thereby improving the reproducibility of plasma treatment.

It is another object of the present invention to provide a plasma processing device, which comprises a heat transmission unit installed between a shower head and an upper electrode, thereby easily adjusting the temperature of the shower head.

In accordance with one aspect of the present invention, the above and other objects can be accomplished by the provision of a plasma processing apparatus for generating plasma in a chamber maintained in a vacuum state and processing a substrate using the plasma, comprising: upper and lower electrodes respectively provided in upper and lower portions of the chamber for applying high-frequency power into the chamber; a shower head connected to the lower portion of the upper electrode for diffusing a process gas into the chamber; a refrigerant channel passing through the shower head in the horizontal direction for providing a passage for passing a refrigerant; and a refrigerant circulating unit connected to both ends of the refrigerant channel for supplying the refrigerant to one end of the refrigerant channel and collecting the refrigerant from the other end of the refrigerant channel to circulate the refrigerant.

In accordance with another aspect of the present invention, there is provided a plasma processing apparatus for generating plasma in a chamber maintained in a vacuum state and processing a substrate using the plasma, comprising: upper and lower electrodes respectively provided in upper and lower portions of the chamber for applying high-frequency power into the chamber; a shower head connected to an edge portion protruded downwardly from the lower surface of the upper electrode for diffusing a process gas into the chamber; a refrigerant channel passing through the upper electrode in the horizontal direction for providing a passage for passing a refrigerant supplied from the outside; a heat transmission unit contacting the upper surface of the shower head and the lower surface of the upper electrode for transmitting the heat of the shower head to the upper electrode; and a refrigerant circulating unit connected to both ends of the refrigerant channel for supplying the refrigerant to one end of the refrigerant channel and collecting the refrigerant from the other end of the refrigerant channel.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Now, preferred embodiments of the present invention will be described in detail with reference to the annexed drawings.

First Embodiment

Figure 1:
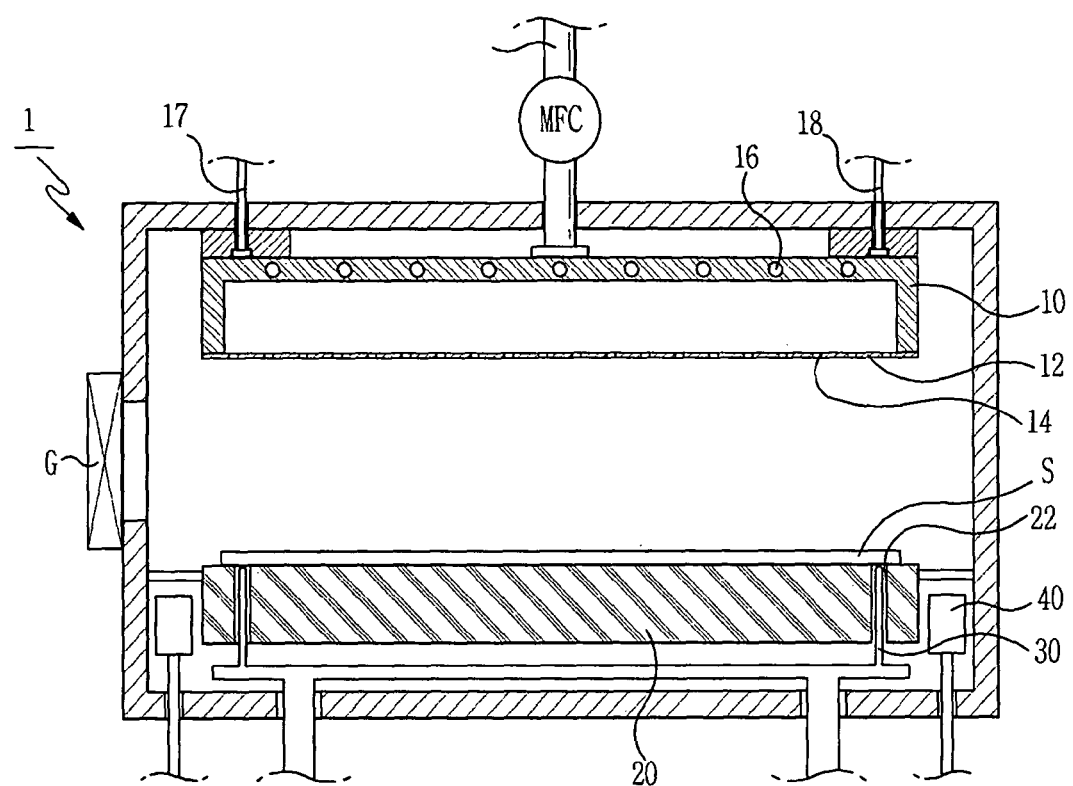
FIG. 1 is a sectional view of a conventional plasma processing apparatus.
Figure 2:
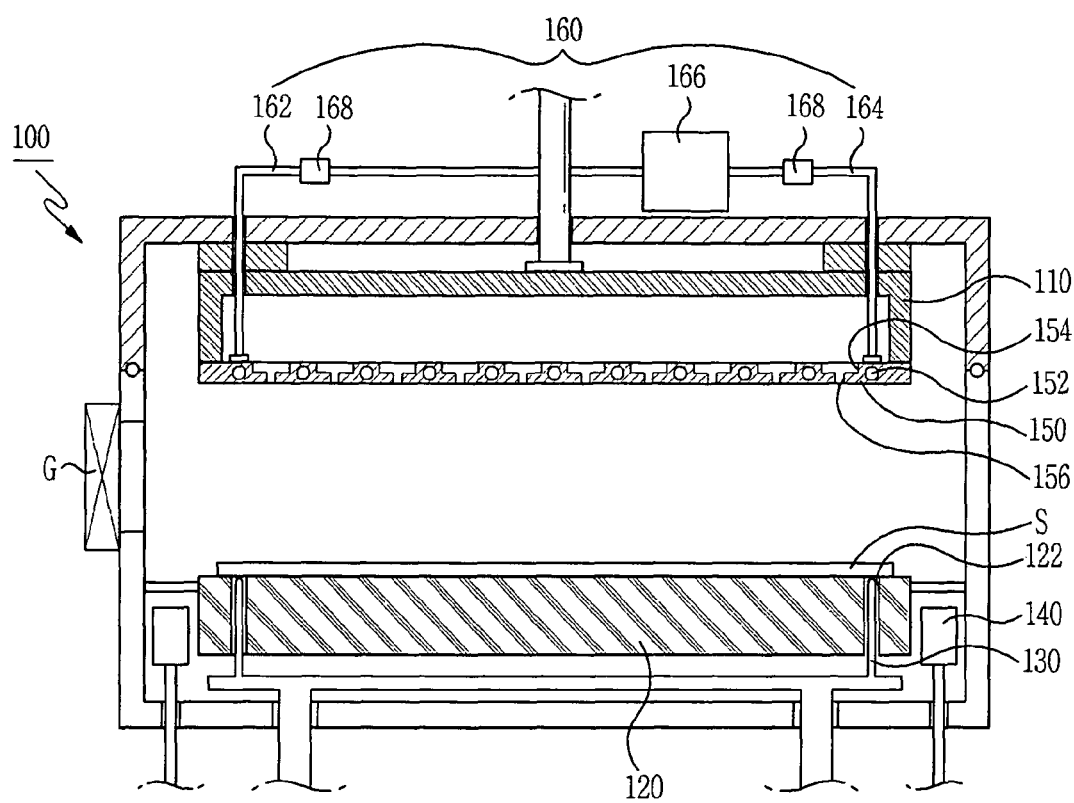
FIG. 2 is a sectional view of a plasma processing apparatus in accordance with a first embodiment of the present invention.

As shown in FIG. 2, a plasma processing apparatus 100 in accordance with a first embodiment of the present invention comprises an upper electrode 110, a lower electrode 120, a shower head 150, internal elevating pins 130, external elevating bars 140, a process gas supply unit (not shown), and an exhaust unit (not shown), which are installed in a chamber maintained in a vacuum state. Here, the structures and functions of the lower electrode 120, the internal elevating pins 130, the external elevating bars 140, the process gas supply unit, and the exhaust unit of the plasma processing apparatus 100 of this embodiment are substantially the same as those of a conventional plasma processing apparatus, and a detailed description thereof will thus be omitted because it is considered to be unnecessary.

The structure and functions of the upper electrode 110 and the shower head 150 of the plasma processing apparatus 100 of this embodiment are different from those of the conventional plasma processing apparatus, and a detailed description thereof will be made in detail, as below.

Differing from the upper electrode 10 of the conventional plasma processing apparatus 1, the upper electrode 110 of the plasma processing apparatus 100 of this embodiment does not have a refrigerant channel formed therethrough. Accordingly, the upper electrode 110 has a simple structure and is easily manufactured.

The shower head 150 is connected to the lower portion of the upper electrode 110, and serves to uniformly diffuse a process gas supplied from the outside into the chamber. In this embodiment, a refrigerant channel 152 is uniformly formed in the horizontal direction throughout all regions of the shower head 150. Since the shower head 150 of the plasma processing apparatus 100 of this embodiment is directly cooled through the refrigerant channel 152, it is easy to control the temperature of the shower head 150. In order to form the refrigerant channel 152 directly through the shower head 150, the shower head 150 has a thickness of approximately 17 mm, while the shower head 12 of the conventional plasma processing apparatus 1 has a thickness of approximately 10 mm.

Both ends of the refrigerant channel 152 are connected to a refrigerant circulating unit 160 so that the refrigerant circulating unit 160 supplies a refrigerant to the refrigerant channel 152 and then collects the refrigerant from the refrigerant channel 152 to circulate the refrigerant. In this embodiment, the refrigerant circulating unit 160 comprises a refrigerant supply pipe 162, a refrigerant collection pipe 164, and a refrigerant circulating pump 166.

The refrigerant supply pipe 162 passes through the chamber, and is connected one end of the refrigerant channel 152. The refrigerant supply pipe 162 serves to supply a new refrigerant from the outside to the refrigerant channel 152.

Identically with the refrigerant supply pipe 162, the refrigerant collection pipe 164 passes through the chamber, and is connected the other end of the refrigerant channel 152. The refrigerant collection pipe 164 serves to collect the waste refrigerant, having been discharged from the refrigerant channel 152 to the outside.

The refrigerant circulating pump 166 is connected to the refrigerant supply pipe 162 and the refrigerant collection pipe 164, and serves to forcibly circulate the refrigerant. A refrigerant storage tank for storing a designated amount of the refrigerant may be installed in the refrigerant circulating pump 166.

In this embodiment, end caps 168 are used to interconnect the refrigerant circulating pump 166 and the refrigerant supply and recovery pipes 162 and 164. The end caps 168 facilitate the connection and disconnection of the refrigerant circulating pump 166, which is prepared separately from the chamber, to and from the refrigerant supply pipe 162 and the refrigerant collection pipe 164, which are fixed to the chamber. In order to maintain and repair the plasma processing apparatus 100, the upper wall of the chamber of the plasma processing apparatus 100 is opened. When the upper wall of the chamber is opened, it is necessary to first separate the refrigerant circulating pump 166 from the refrigerant supply pipe 162 and the refrigerant collection pipe 164. Accordingly, since the refrigerant circulating pump 166 is easily connected to and disconnected from the refrigerant supply pipe 162 and the refrigerant collection pipe 164, the plasma processing apparatus 100 of this embodiment is advantageous in that its maintenance and repair is easy.

In this embodiment, as shown in FIG. 2, the refrigerant supply pipe 162 and the refrigerant collection pipe 164 are protruded to the outside through the upper wall of the chamber. This structure also facilitates the maintenance and repair of the plasma processing apparatus 100. That is, when the refrigerant supply pipe 162 and the refrigerant collection pipe 164 are protruded to the outside through side walls of the chamber, a space occupied by the plasma processing apparatus 100 is enlarged and the refrigerant supply pipe 162 and the refrigerant collection pipe 164 may hinder the maintenance and repair of the plasma processing apparatus 100.

Figure 3:
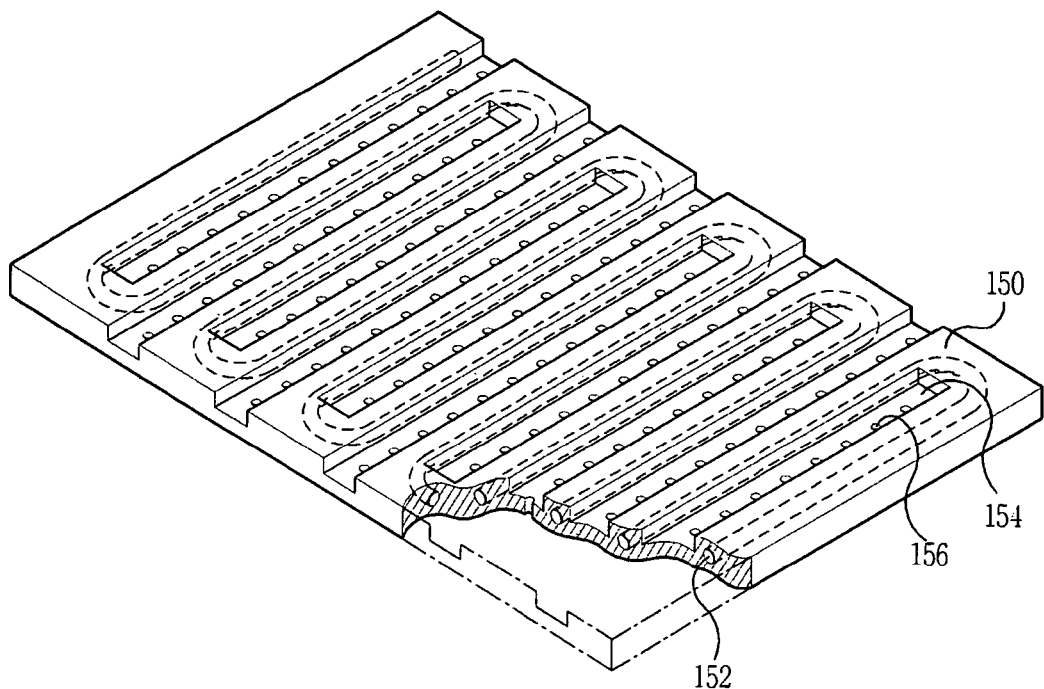
FIG. 3 is a perspective view of a shower head of the plasma processing apparatus in accordance with the first embodiment of the present invention.

As described above, the shower head 150 of the plasma processing apparatus 100 of this embodiment has a larger thickness than that of the shower head of the conventional plasma processing apparatus. Thereby, the shower head 150 has an increased weight. In order to reduce the weight of the shower head 150, grooves 154 are formed in the upper surface of the shower head 150. That is, as shown in FIG. 3, the grooves 154, which are longitudinally extended, are carved in the upper surface of the shower head 150 at positions away from the refrigerant channel 152. Process gas diffusion holes 156 for diffusing the process gas are formed along the grooves 154 through the shower head 150 in the thickness direction. When the grooves 154 are formed in the shower head 150, the shower head 150 has a reduced weight, thereby reducing a load applied to the plasma processing apparatus 100. Further, the process gas diffused through the process gas diffusion holes 156 flows smoothly, thereby being uniformly diffused.

Second Embodiment

Figure 4:
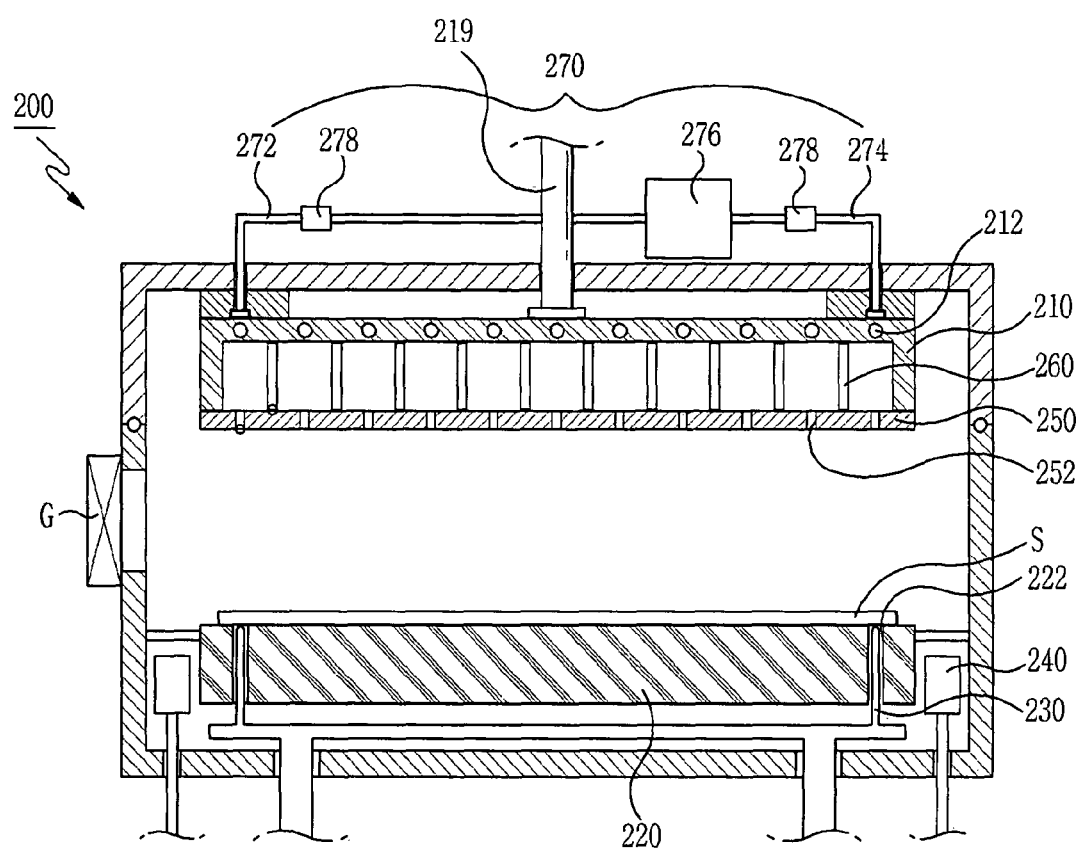
FIG. 4 is a sectional view of a plasma processing apparatus in accordance with a second embodiment of the present invention.

As shown in FIG. 4, a plasma processing apparatus 200 in accordance with a second embodiment of the present invention comprises an upper electrode 210, a lower electrode 220, a shower head 250, a heat transmission unit 260, a refrigerant circuiting unit 270, internal elevating pins 230, external elevating bars (not shown), a process gas supply unit (not shown), and an exhaust unit 240, which are installed in a chamber maintained in a vacuum state. Here, the structures and functions of the upper electrode 210, the lower electrode 220, the internal elevating pins 230, the external elevating bars, the process gas supply unit, and the exhaust unit 240 of the plasma processing apparatus 200 of this embodiment are substantially the same as those of the conventional plasma processing apparatus, and a detailed description thereof will thus be omitted because it is considered to be unnecessary.

The structure and functions of the shower head 250, the heat transmission unit 260, and the refrigerant circulating unit 270 of the plasma processing apparatus 200 of this embodiment are different from those of the conventional plasma processing apparatus, and a detailed description thereof will be made in detail, as below.

The heat transmission unit 260 is provided on the upper surface of the shower head 250 of the plasma processing apparatus 200 of this embodiment. The heat transmission unit 260 serves to transmit the heat of the shower head 250 to the upper electrode 210. In this embodiment, the heat transmission unit 260 is disposed in a space formed between the upper surface of the shower head 250 and the lower surface of the upper electrode 210 such that the heat transmission unit 260 contacts both the upper surface of the shower head 250 and the lower surface of the upper electrode 210. Thereby, the heat transmission unit 260 transmits the heat of the shower head 250 to the upper electrode 210. On the other hand, although a space having a designated height exists between the shower head and the upper electrode in the conventional plasma processing apparatus, the conventional plasma processing apparatus does not comprise a direct contact unit between the shower head and the upper electrode, thus causing a difficulty in directly cooling the shower head. The plasma processing apparatus 200 of this embodiment solves the above problem of the conventional plasma processing apparatus. That is, the upper electrode 210, which is cooled directly by the refrigerant, contacts the shower head 250 at several portions so that the heat of the shower head 250 is easily transmitted to the upper electrode 210.

Preferably, the heat transmission unit 260 of the plasma processing apparatus 200 of this embodiment is made of a metal having an excellent thermal conductivity.

Figure 5:
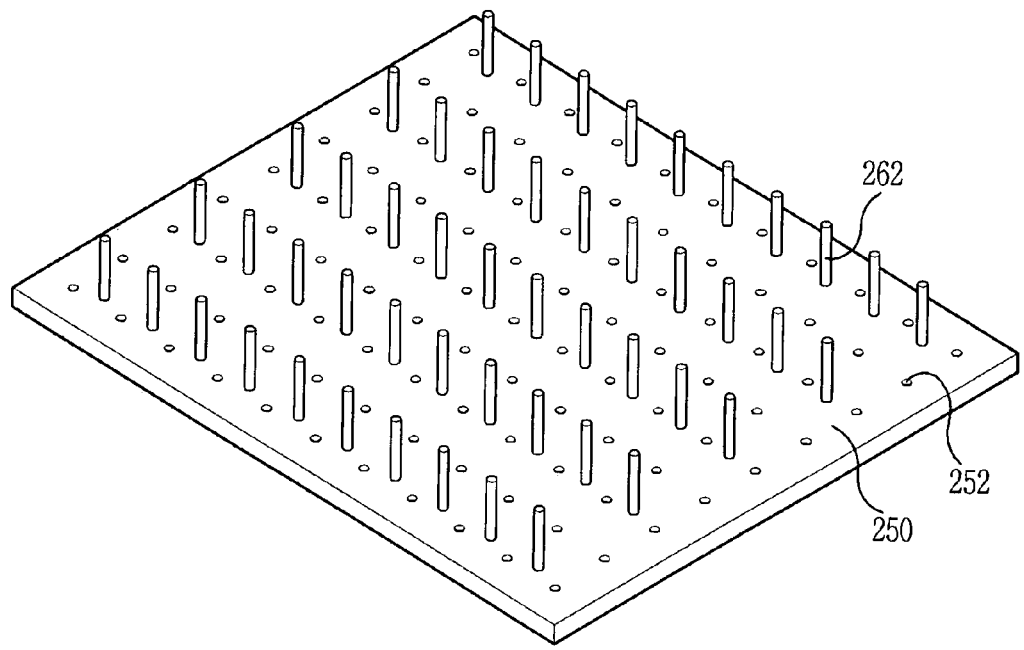
FIG. 5 is a perspective view of a heat transmission unit of the plasma processing apparatus in accordance with the second embodiment of the present invention.

As shown in FIG. 5, the heat transmission unit 260 may comprise a plurality of heat transmission pins 262 separated from each other by a designated interval. The heat transmission pins 262 are uniformly disposed throughout all regions of the shower head 250.

Figure 6:
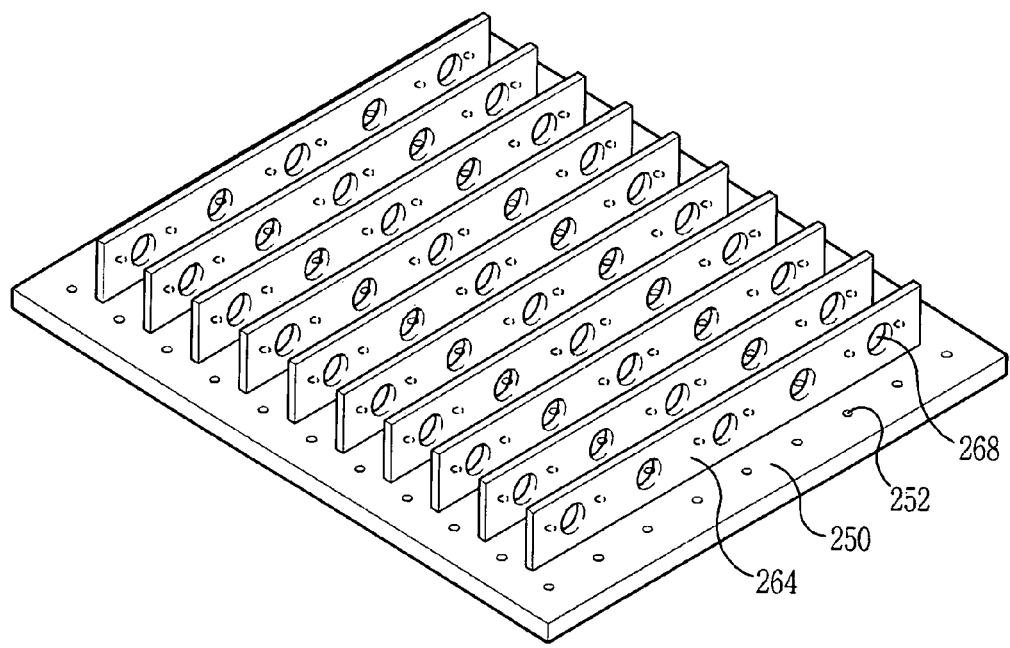
FIG. 6 is a perspective view of another heat transmission unit of the plasma processing apparatus in accordance with the second embodiment of the present invention.
Figure 7:
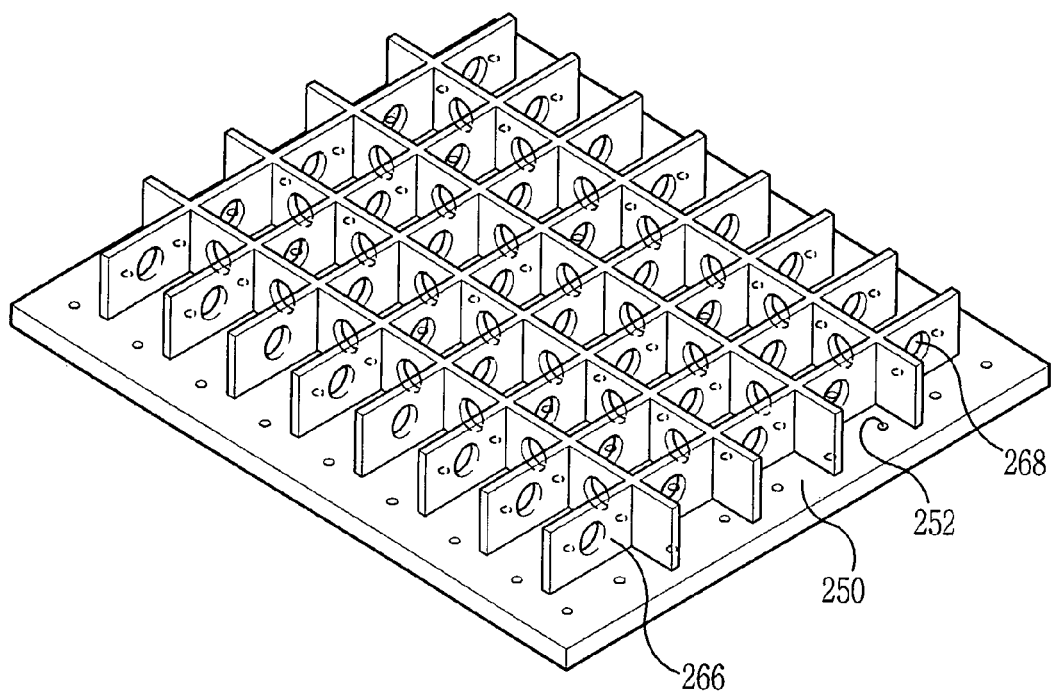
FIG. 7 is a perspective view of yet another heat transmission unit of the plasma processing apparatus in accordance with the second embodiment of the present invention.

Further, as shown in FIGS. 6 and 7, the heat transmission unit 260 may comprise a plurality of heat transmission plates 264 or a heat transmission lattice 266. Preferably, the heat transmission plates 264 or the heat transmission lattice 266 are uniformly disposed throughout all regions of the shower head 250 so as to uniformly adjust the temperature of all regions of the shower head 250.

When the heat transmission unit 260 comprises the heat transmission plates 264 or the heat transmission lattice 266, holes 268 for passing a process gas are preferably formed through the heat transmission plates 264 or the heat transmission lattice 266, thereby allowing the process gas to smoothly flow. As shown in FIGS. 6 and 7, a plurality of the holes 268 pass through the heat transmission plates 264 or the heat transmission lattice 266 in the thickness direction.

A refrigerant channel 212 is formed in the upper electrode 210. The refrigerant channel 212 passes through the upper electrode 210 in the horizontal direction such that the refrigerant channel 212 is disposed throughout all regions of the upper electrode 210.

Both ends of the refrigerant channel 212 are connected to the refrigerant circulating unit 270 so that the refrigerant circulating unit 270 supplies a refrigerant to the refrigerant channel 212 and then collects the refrigerant from the refrigerant channel 212 to circulate the refrigerant. In this embodiment, the refrigerant circulating unit 270 comprises a refrigerant supply pipe 272, a refrigerant collection pipe 274, and a refrigerant circulating pump 276.

The refrigerant supply pipe 272 passes through the wall of the chamber, and is connected to one end of the refrigerant channel 212. The refrigerant supply pipe 272 serves to supply a new refrigerant from the outside to the refrigerant channel 212.

Identically with the refrigerant supply pipe 272, the refrigerant collection pipe 274 passes through the wall of the chamber, and is connected the other end of the refrigerant channel 212. The refrigerant collection pipe 274 serves to collect the waste refrigerant, having being discharged from the refrigerant channel 212 to the outside.

The refrigerant circulating pump 276 is connected to the refrigerant supply pipe 272 and the refrigerant collection pipe 274, and serves to forcibly circulate the refrigerant. A refrigerant storage tank for storing a designated amount of the refrigerant may be installed in the refrigerant circulating pump 276.

In this embodiment, end caps 278 are used to interconnect the refrigerant circulating pump 276 and the refrigerant supply and recovery pipes 272 and 274. The end caps 278 facilitate the connection and disconnection of the refrigerant circulating pump 276, which is prepared separately from the chamber, to and from the refrigerant supply pipe 272 and the refrigerant collection pipe 274, which are fixed to the chamber. In order to maintain and repair the plasma processing apparatus 200, the upper wall of the chamber of the plasma processing apparatus 200 is opened. When the upper wall of the chamber is opened, it is necessary to first separate the refrigerant circulating pump 276 from the refrigerant supply pipe 272 and the refrigerant collection pipe 274. Accordingly, since the refrigerant circulating pump 276 is easily connected to and disconnected from the refrigerant supply pipe 272 and the refrigerant collection pipe 274, the plasma processing apparatus 200 of this embodiment is advantageous in that its maintenance and repair is easy.

In this embodiment, as shown in FIG. 4, the refrigerant supply pipe 272 and the refrigerant collection pipe 274 are protruded to the outside through the upper wall of the chamber. This structure also facilitates the maintenance and repair of the plasma processing apparatus 200. That is, when the refrigerant supply pipe 272 and the refrigerant collection pipe 274 are protruded to the outside through side walls of the chamber, a space occupied by the plasma processing apparatus 200 is enlarged and the refrigerant supply pipe 272 and the refrigerant collection pipe 274 may hinder the maintenance and repair of the plasma processing apparatus 200.

As apparent from the above description, the present invention provides a plasma processing apparatus, which has several effects, as below.

First, since the plasma processing apparatus of the present invention comprises a refrigerant channel formed in a shower head so that the shower head can be cooled, it is easy to adjust the temperature of the shower head, thereby improving the reproducibility of plasma treatment.

Second, the plasma processing apparatus of the present invention comprises a plurality of grooves formed in the upper surface of the shower head, thereby decreasing a burden caused by the increase in the thickness and weight of the shower head due to the formation of the refrigerant channel in the shower head, facilitating the smooth flow of a process gas to increase cooling efficiency, and allowing the distribution of the temperature to be uniformed.

Third, the plasma processing apparatus of the present invention further comprises a heat transmission unit formed between the shower head and an upper electrode so that the upper electrode cooled by a refrigerant contacts the shower head, thereby causing the heat of the shower head to be easily transmitted to the upper electrode and easily adjusting the temperature of the shower head.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A plasma processing apparatus for generating plasma in a chamber maintained in a vacuum state and processing a substrate using the plasma, the apparatus comprising:
    upper and lower electrodes respectively provided in upper and lower portions of the chamber for applying high-frequency power into the chamber, wherein the upper electrode comprises a plate portion and a protrusion portion that extends downward from an outer peripheral edge portion of the plate portion;
    a shower head connected to a lower end of the protrusion portion of the upper electrode such that a space is formed between an upper surface of the shower head and a lower surface of the plate portion of the upper electrode, wherein the shower head diffuses a process gas into the chamber;
    a refrigerant channel formed within the shower head and extending in horizontal direction, wherein the refrigerant channel guides refrigerant through the shower head; and
    a refrigerant circulating unit connected to both a supply end and a collection end of the refrigerant channel so as to supply refrigerant through the supply end of the refrigerant channel and collect refrigerant at the collection end of the refrigerant channel to circulate refrigerant through the shower head, wherein a groove is carved in a surface of the shower head facing the upper electrode, at a position where the refrigerant channel is not formed, and a plurality of holes is formed in the groove, extending downward from a lower surface of the groove to a lower surface of the shower head such that process gas is diffused into the chamber through the plurality of holes.

2. The plasma processing apparatus as set forth in claim 1, wherein the plurality of holes extends in a thickness direction of the shower head.

3. The plasma processing apparatus as set forth in claim 2, wherein a width of the groove is greater than a diameter of each of the plurality of holes.

4. The plasma processing apparatus as set forth in claim 3, wherein the refrigerant circulating unit comprises:
    a supply pipe connected to the supply end of the refrigerant channel and to an external source so as to supply unused refrigerant to the refrigerant channel;
    a collection pipe connected to the collection end of the refrigerant channel and an outside of the chamber so as to collect waste refrigerant from the refrigerant channel; and
    a circulating pump connected to the supply pipe and the refrigerant pipe so as to circulate the refrigerant, wherein the supply pipe and the collection pipe pass through an upper wall of the chamber to outside of the chamber.

5. The plasma processing apparatus as set forth in claim 4, wherein the circulating pump is connected to the supply pipe and the collection pipe by end caps.

6. A plasma processing apparatus for generating plasma in a chamber maintained in a vacuum state and processing a substrate using the plasma, the apparatus comprising:
    upper and lower electrodes respectively provided in upper and lower portions of the chamber for applying high-frequency power into the chamber, wherein the upper electrode comprises a plate portion and a protrusion portion that extends downward from an outer peripheral edge portion of the plate portion;
    a shower head connected to a lower end of the protrusion portion of the upper electrode such that a space is formed between an upper surface of the shower head and a lower surface of the plate portion, wherein the shower head diffuses a process gas into the chamber;
    a channel formed within the upper electrode and extending in a horizontal direction, wherein the channel guides refrigerant supplied from an external source through the upper electrode;
    a plurality of heat transmission plates that contacts the upper surface of the shower head and the lower surface of the plate portion of the upper electrode so as to transmit heat from the shower head to the upper electrode, the plurality of heat transmission plates comprising a plurality of vertical walls extending between the shower head and the upper electrode and separated from each other by a designated interval in the horizontal direction;
    a circulating unit connected to first and second ends of the channel so as to supply refrigerant to the first end of the channel and collect refrigerant from the second end of the channel; and
    a plurality of holes horizontally formed through the plurality of vertical walls of the heat transmission plates, wherein the plurality of holes guide process gas therethrough.

7. The plasma processing apparatus as set forth in claim 6, wherein the heat transmission unit is made of a metal material having a high thermal conductivity.

8. The plasma processing apparatus as set forth in claim 6, wherein the plurality of heat transmission has a lattice form.

9. The plasma processing apparatus as set forth in claim 6, wherein the plurality of heat transmission plates are oriented such that bottom edges thereof contact the upper surface of the shower head and top edges thereof contact the lower surface of the upper electrode, and the plurality of holes are formed between the top and bottom edges of the plurality of heat transmission plates.

10. The plasma processing apparatus as set forth in claim 6, wherein the heat transmission unit is enclosed within the space enclosed by the lower surface of the upper electrode, the upper surface of the shower head, and an inner surface of the protrusion portion of the upper electrode.

* * * * *